United States Patent [19]

Choi

[11] Patent Number: 5,013,918

[45] Date of Patent: May 7, 1991

[54] MULTICOLOR INFRARED PHOTODETECTOR

[75] Inventor: Kwong-Kit Choi, Tinton Falls, N.J.

[73] Assignee: The United States of America as represented by the Secretary of the Army, Washington, D.C.

[21] Appl. No.: 503,015

[22] Filed: Apr. 2, 1990

[51] Int. Cl.$^5$ .............................................. H01J 40/14
[52] U.S. Cl. ...................... 250/338.4; 357/4
[58] Field of Search .................. 250/338.4; 357/45 L, 357/16, 30 E

[56] References Cited

U.S. PATENT DOCUMENTS

| Re. 32,893 | 3/1989 | Miller | 250/211 J |
| 4,796,067 | 1/1989 | Shimizu et al. | 357/45 L |
| 4,822,992 | 4/1989 | Bar-Joseph et al. | 250/211 J |
| 4,894,526 | 1/1990 | Bethea et al. | 250/211 R |

Primary Examiner—Jack I. Berman
Assistant Examiner—Kiet T. Nguyen
Attorney, Agent, or Firm—Michael Zelenka; Judith Michal

[57] ABSTRACT

A multicolor infrared detection device comprising a number of doped quantum well structural units. Each unit consists of a thick well and a thin well separated by a thin barrier. This arrangement produces strong coupling. Infrared radiation incident on the device gives rise to intersubband absorption. For each transition a photosignal results which allows the detection of a plurality of incident frequencies.

3 Claims, 5 Drawing Sheets

INFRARED
RADIATION

MULTICOLOR INFRARED PHOTODETECTOR

The invention described herein may be manufactured, used, and licensed by or for the Government for governmental purposes without the payment to me of any royalties thereon.

TECHNICAL FIELD

The present invention relates in general to infrared radiation detection devices and, more particularly, to detection devices sensitive to infrared radiation composed of multiple wavelengths

BACKGROUND OF THE INVENTION

Infrared fibre optics for communication and infrared remote control and sensing technology are two important technological areas in modern electronics. In these applications, a sensitive and fast infrared sensor is the most crucial element in the system. Recently, Levine et al have disclosed a new multiple quantum well photodetector. This device is discussed in two separate articles, the first of which is "New 10μm Infrared Detector Using Intersubband Absorption In Resonant Tunneling GaAlAs Superlattices," Applied Physics Letters, Vol. 50 (1987), pg. 1092–1094. The authors introduce a high-speed infrared detector based on intersubband absorption and sequential resonant tunneling in doped GaAs/$Al_xGa_{1-x}As$ quantum well superlattices. They term the device a STAIR detector. In this type of detector infrared light which is resonant with the intersubband transition excites electrons from the doped ground state to the excited state where they can tunnel out of the well through the thin top of the barrier. These photogenerated hot electrons then travel a mean free path thereby generating a photocurrent before being captured by the wells "Broadband 8–12μm High-sensitivity GaAs Quantum Well Infrared Photodector," Applied Physics Letters, Vol. 54 (1989), pg. 2704–2706, also by Levine et al contributes no novel features but does extend the range of parameters of the device.

In a related article by Kwong-Kit Choi et al titled "Multiple Quantum Well 10μm GaAs/$Al_xGa_{1-x}As$ Infrared Detector With Improved Responsivity," a higher responsivity is achieved in this type of detection device. This occurs by using thicker and higher $Al_xGa_{1-x}As$ superlattice barriers to reduce the dark current. This allowed the detector to be operated at higher biases. Additional background can be obtained from European Patent No. 883000 96.0 -"Infrared-Radiation Detector Device," filed by Clyde G. Bethea et al The essential feature of this type of device is that the detector consists of a number of isolated quantum wells and is capable of detecting radiation of one particular frequency with a certain bandwidth. The detecting frequency cannot be changed by applying voltage bias. However, for optical communication and controlling purposes, it is desirable that the optical sensor can receive parallel coded messages to increase the rate of data transfer and to discriminate faulty signals. In this case, a sensor that is sensitive to more than one frequency is important. The present invention achieves the goal of multicolor infrared detection.

SUMMARY OF INVENTION

It is therefore an object of this invention to provide a new and novel detector device which is sensitive to radiation of a plurality of frequencies.

It is another object of the invention to provide a detection device in which the detecting frequency can be changed by applying voltage bias.

These objects and other objects are achieved in accordance with the present invention, which makes advantageous use of strongly coupled quantum wells uniquely constructed to achieve multicolor infrared detection.

The present invention comprises a semiconductor superlattice comprising an array of doped quantum well pairs which form an infrared radiation detection device. Each pair of quantum wells consists of a thick well and a thin well separated by a thin barrier. Within the wells, there is a ground electron state and a number of excited states with different energies. Infrared radiation incident on the superlattice gives rise to intersubband absorption which excites electrons from the ground state into one of the excited states. A photo signal results as the photo-excited electrons tunnel out of the well, thereby producing a current.

In the preferred embodiment, the thicker quantum well, when it is isolated, is chosen to contain two bound states (denoted $E_1$ and $E_2$ respectively). The width of the thin well is adjusted such that an isolated thin well has an energy level (denoted $E_1'$) very close to $E_2$.

BRIEF DESCRIPTION OF THE DRAWINGS

The invention will be more fully appreciated from the following detailed description when the same is considered in connection with the accompanying drawings in which.

DETAILED DESCRIPTION OF THE DRAWINGS

Figure 1:
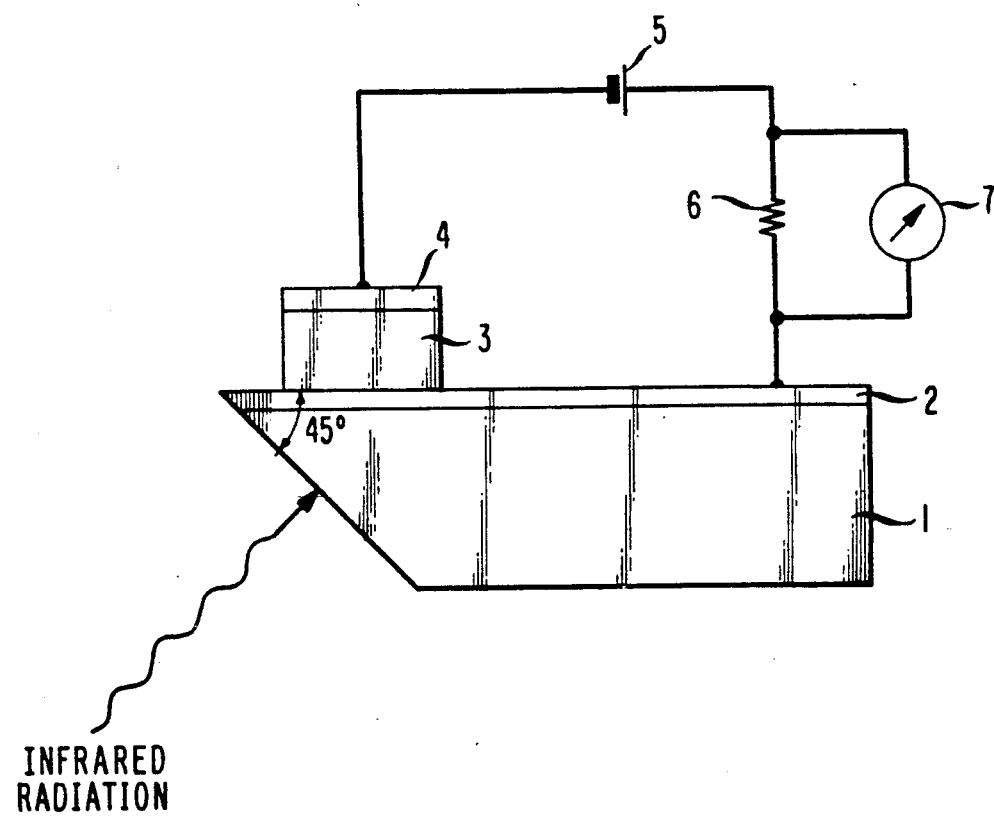
FIG. 1 is a schematic representation, greatly enlarged, of the structure of an infrared radiation detector in accordance with the present invention in an arrangement which further includes a voltage source and a current measuring device.

FIG. 1 shows a semi-insulating substrate (1), contact layer (2), semiconductor superlattice (3), contact layer (4), voltage source (5), a series resistor (6), and a voltmeter (7) which complete an electric circuit for light sensing operation. In operation, the detector is cooled to a desired temperature, and the polished face of the substrate is exposed to the infrared radiation. The device is biased by a voltage source through the two contact layers, and the photocurrent can, for example, be sensed by either a current meter or by a series resistor as shown.

Illumination of the superlattice is shown at an angle via a polished face of the substrate which has been cut at an angle. This was found to be convenient for experimental device evaluation. The angle shown in FIG. 1 is a 45° angle. A superlattice is a periodic arrangement of layers of two different materials such as ABABAB . . . where A represents one layer and B represents another layer. Infrared radiation is made incident on these superlattice layers. In order to initiate excitation, the electric field vector associated with the radiation has to be perpendicular to the material layers. That is, the light has to travel parallel to the layers. One convenient way to do this is to have the infrared radiation incident on the superlattice at the 45° angle shown. With this arrangement, the radiation with the electric vector component perpendicular to the superlattice layers will be absorbed. More generally, illumination may be in any direction having an electric field component perpendicular to the superlattice layers.

Figure 2:
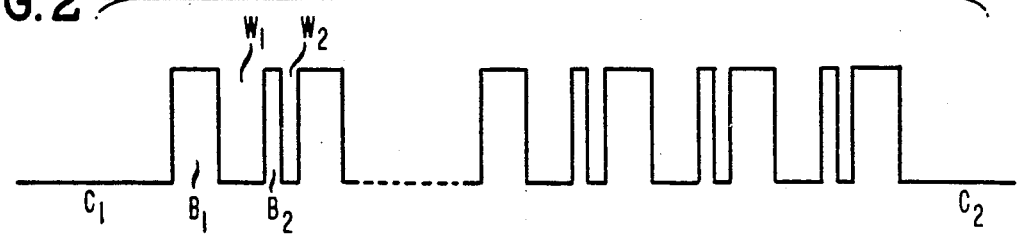
FIG. 2 is the energy band diagram of the present invention.

A quantum well is created when a smaller band gap material is placed between two wider band gap materials. A quantum well acts like a "trap" to an electron. Inside a quantum well, there are discrete energy levels due to size quantization. The present invention comprises an array of doped quantum well units. A typical embodiment of the present invention might consist of fifty units. FIG. 2 shows four units. Each unit consists of a thick barrier ($B_1$), a thick well ($W_1$), a thin barrier ($B_2$), and a thin well ($W_2$). These units are sandwiched between contact layers $C_1$ and $C_2$.

Figure 3:
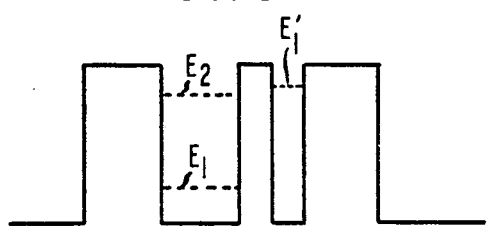
FIG. 3 is an energy band diagram illustrating the energy levels of the preferred embodiment when the wells are isolated from one another.

In the preferred embodiment of the present invention, the thicker quantum well, when it is isolated, is chosen to contain two bound states denoted by $E_1$ and $E_2$ respectively. The width of the thin well is adjusted such that an isolated thin well has an energy level denoted by $E_1$, very close to $E_2$. This situation is shown in FIG. 3. The energy level structure within each well in FIG. 3 is at zero bias.

Figure 4:
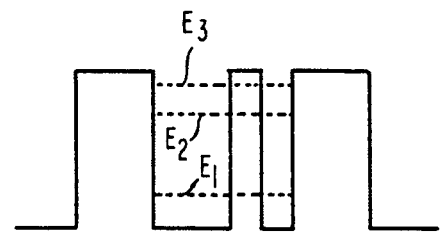
FIG. 4 is an energy band diagram illustrating the energy levels of the preferred embodiment when the wells are close enough together to become coupled.

However, when barrier ($B_2$) is thin enough, a new situation arises. The electrons located in each well penetrate into each other and change the level structure of each well. Such wells are said to be "coupled." The level structure becomes common to both of the wells. The new levels are indicated in FIG. 4 and are denoted by new $E_1$, $E_2$, and $E_3$. The coupled quantum wells shown in FIG. 4 are also at zero bias. The coupled structure exhibits different characteristics compared with the isolated wells. The most important difference is that in a simple single well unit as utilized in the Levine et al's designs, the electron wavefunction associated with each energy level has a definite parity, either even or odd. Since the intersubband optical absorption is an optical dipole transition, the electrons in the ground state, which is even in parity, can only be excited by radiation to the odd parity states, i.e. the second level, the fourth level, . . . , etc. Hence, not all the levels can be used to detect radiation. However, for the present invention of coupled wells, each level is of mixed parity due to the breaking of the parity symmetry by the unequal well thickness. In this case, all transitions from the ground state to any excited state are allowed, leading to multicolor detection capability. Corresponding to each optical transition, the radiation of a particular wavenumber $v$ will be detected where $v=(E_n-E_1)/hc$ and where $E_n$ is the nth energy level, h is the plank constant and c is the speed of light.

Another important feature of the coupled quantum well structure is the voltage tunability of the detector, which is not shared by the Levine et al's design. For a simple single well design, the separations between the excited states and the ground state is extremely insensitive to the applied voltage. However, for the coupled quantum well structure, the separation between the levels is strongly affected by the applied voltage. This is because an applied voltage shifts the relative level positions of each well. At each applied voltage, the frequencies of detection are different. Detectors of different frequencies can therefore be obtained by changing the applied voltage. The fact that the detection wavenumber can be tuned by the applied voltage is illustrated in FIGS. 5, 6, 7, and 8.

Figure 5:
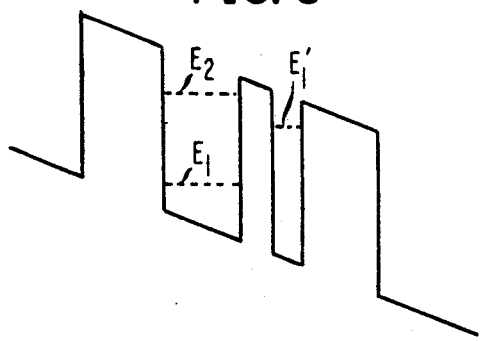
FIG. 5 is an energy band diagram illustrating the quantum well structure of the preferred embodiment when the wells are isolated and are also subject to a forward bias.

In FIG. 5 a quantum well unit according to the present invention is shown assuming that the wells are isolated. Energy levels $E_1$, $E_2$, and $E_1$, are denoted. The structure is subject to a forward bias. Under bias the energy level $E_1$, moves closer to $E_1$.

Figure 6:
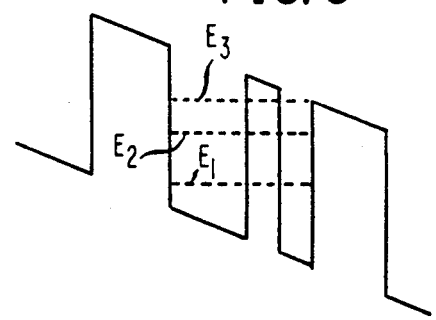
FIG. 6 is an energy band diagram illustrating the quantum well structure of the preferred embodiment when the wells are close enough together to become coupled and are also subject to a forward bias.

In FIG. 6 the wells are made close enough to become coupled. New energy levels $E_1$, $E_2$, and $E_3$ form which are common to both wells. The structure is subject to a forward bias. The motion of $E_1'$ toward $E_1$ under the condition of a forward bias makes combined levels $E_2$ and $E_3$ move closer to $E_1$. Thus, the transition energy and the detection wavenumber are both reduced.

Figure 7:
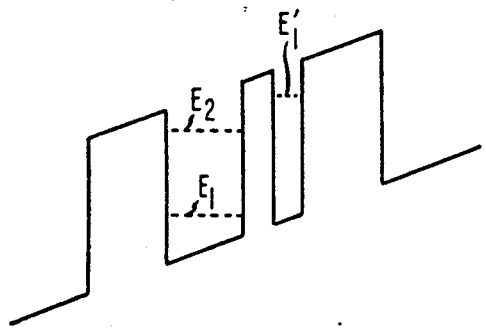
FIG. 7 is an energy band diagram illustrating the quantum well structure of the preferred embodiment when the wells are isolated and are also subject to a reverse bias.
Figure 8:
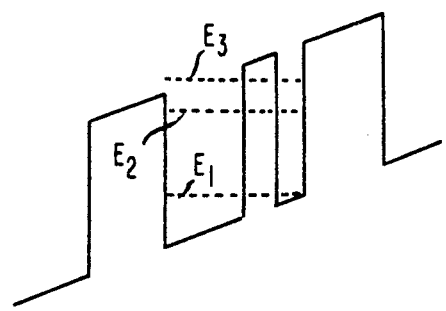
FIG. 8 is an energy band diagram illustrating the quantum well structure of the preferred embodiment when the wells are close enough together to become coupled and are also subject to a reverse bias.

In the reverse bias shown in FIGS. 7 and 8, the level $E_1$, moves away from $E_1$ which leads to a larger separation in energy and increased detection wavenumbers.

Figure 9:
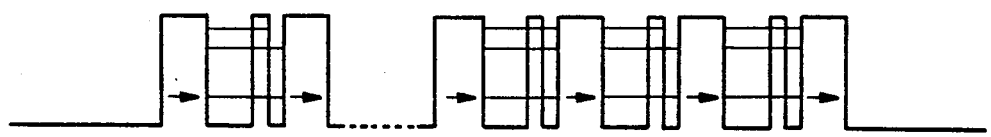
FIG. 9 is an energy band diagram illustrating the dark current transport mechanism for the condition of a small applied bias.

FIG. 9 shows the dark current transport mechanism for the condition of a small applied bias. The electrons tunnel from the ground level of one well into the ground level of the next well.

Figure 10:
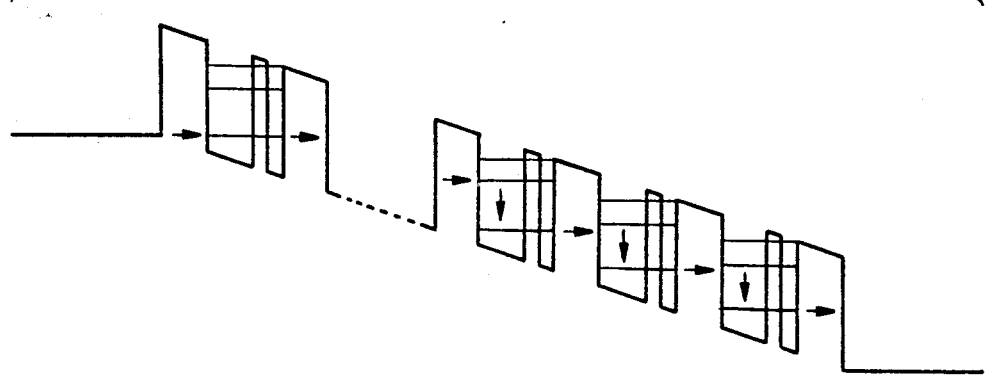
FIG. 10 is an energy band diagram illustrating the dark current transport mechanism for the condition of a large applied bias.

FIG. 10 shows the condition for large applied bias. The electrons tunnel from the ground level of one well into the upper levels of the adjacent well and then relax to the ground level before tunneling into the next well. This process creates high field domains in the device.

Figure 11:
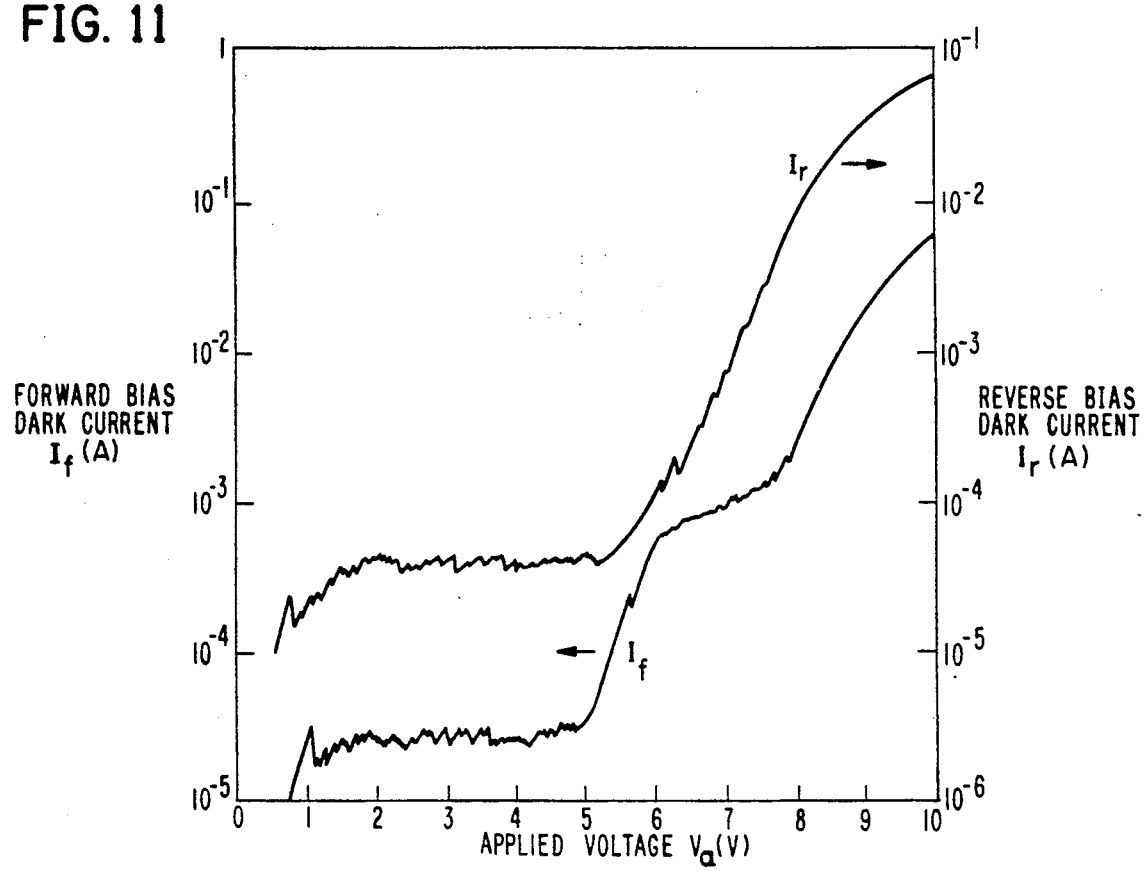
FIG. 11 shows the dark current-voltage characteristics in both forward and reverse bias at a temperature equal to 4.2° K.

FIG. 11 shows the dark current-voltage characteristics in both forward and reverse bias at a temperature equal to 4.2° K. The formation of high field domains can be observed as oscillations in the dark current.

When the device is exposed to infrared radiation, the electrons in the high field domain are excited from the ground state to one of the excited states. The electrons then tunnel out of the well forming hot electrons. Since the hot electrons can move more freely across the device then the tunneling electrons, the detector will register an increase in current flow. From this increase, the radiation is detected.

Figure 12:
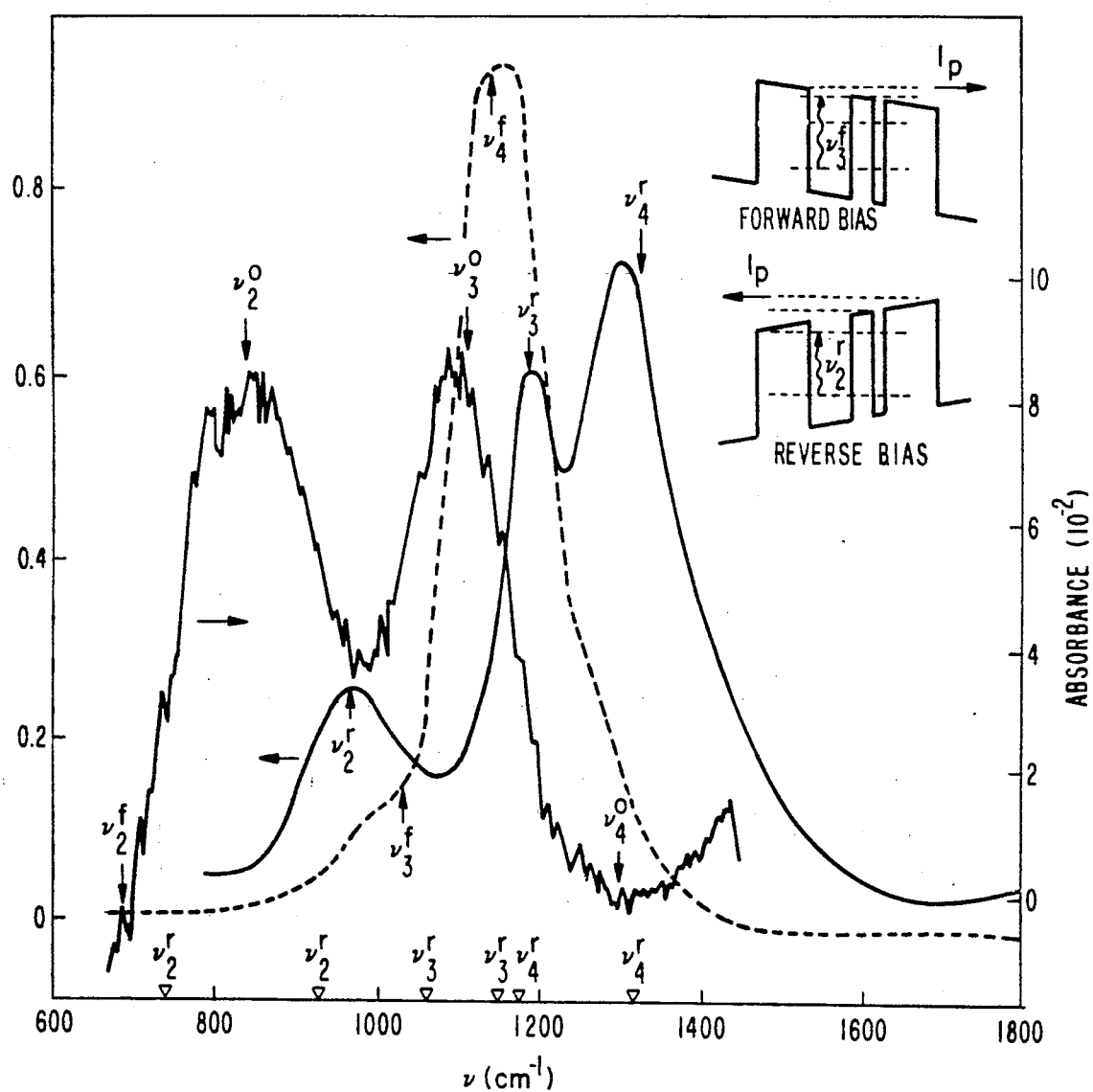
FIG. 12 shows the light absorption curve as a function of wavenumber at zero bias and the photocurrent detected at both forward and reverse bias.
Figure 13:
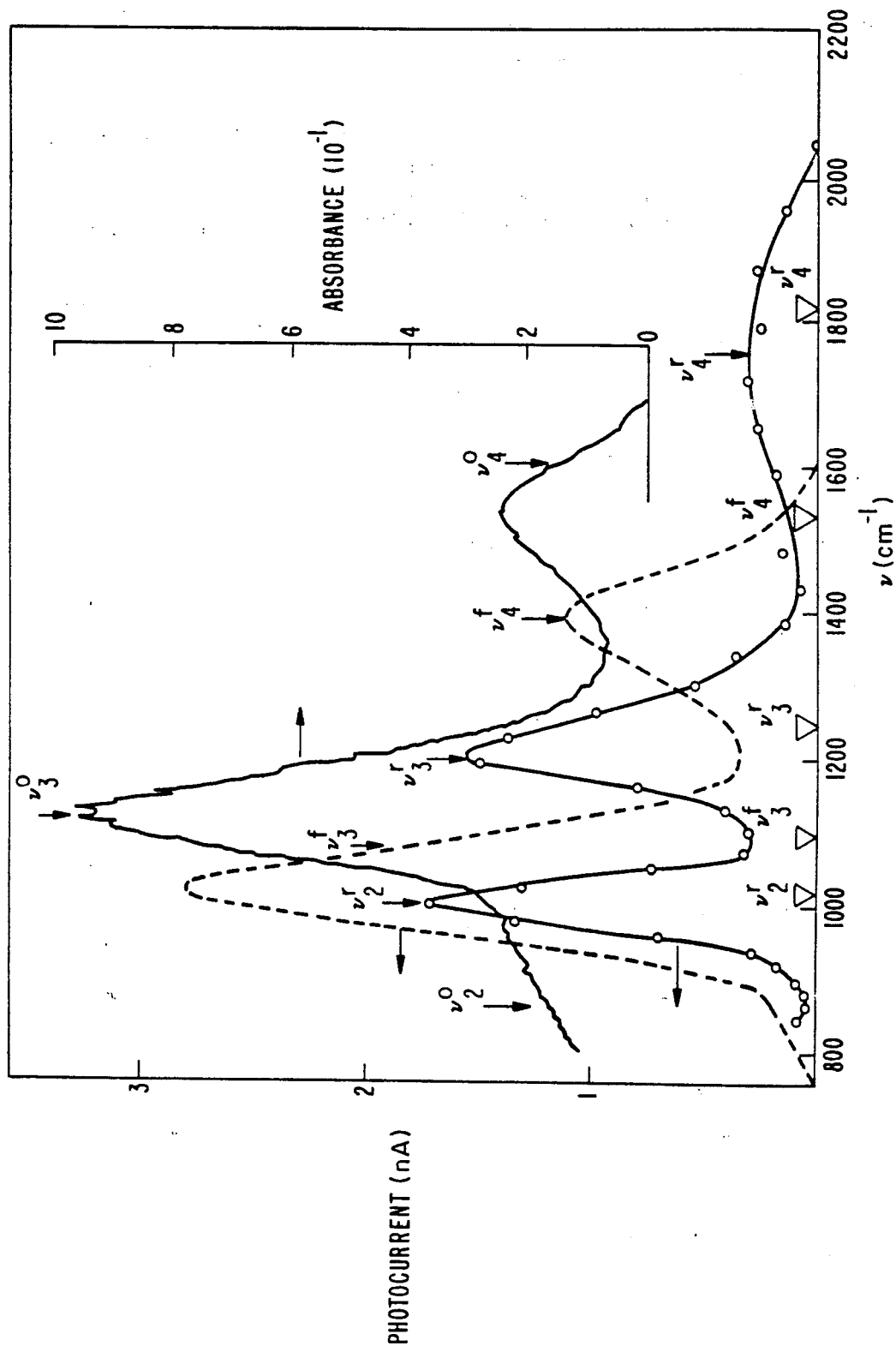
FIG. 13 shows the photoresponse of the detector described in FIG. 11.

FIGS. 12 and 13 show absorption characteristics of two samples of the preferred embodiment. The first sample is grown on a semi-insulating GaAs substrate. It consists of 50 periods of a unit composed of 65 Å GaAs doped with $n=1.0\times10^{18}cm^{-3}$, 40 Å undoped $Al_{0.25}Ga_{0.75}As$, 14 Å undoped GaAs, and 150Å undoped $Al_{0.25}Ga_{0.75}As$. The quantum wells are sandwiched between the top (0.5μm) and the bottom (1μm) GaAS contact layers in which $n=1\times10^{18}cm^{-3}$. FIG. 12 shows the light absorption curve as a function of wavenumber at zero bias and the photocurrent detected at both forward and reverse bias. At zero bias, two absorption peaks are observed at wavenumbers equal to $\nu^o$ and $\nu_3^o$, the superscript denotes the biasing condition and the subscript denotes the final level of the transition. Under forward bias, two photocurrent peaks are observed at $\nu_3^f$ and $\nu_4^f$ whereas under reverse bias, three photocurrent peaks are observed at $\nu_2^r$, $\nu_3^r$, and $\nu_4^r$. Note that $\nu_3^f$ is smaller than $\nu_3^o$, whereas $\nu_3^r$ is larger than $\nu_3^o$. The photocurrent peak at $\nu_2^f$ is not observed because the electrons are still deep inside the well due to the small $E_2$ in forward bias so that the excited electrons cannot escape out of the well. The arrows in the figure are the expected location of the photocurrent peaks based on the structure of the quantum wells.

FIG. 13 shows a similar experimental result for another detector. This detector has a similar structural design as the previous detector except that the barrier height of the present device is higher. The device consists of 50 periods of 72 Å GaAs doped at $n=1\times10^{18}cm^{-3}$, 39 Å $Al_{0.31}Ga_{0.69}As$, 20 Å undoped GaAs, and 154 Å undoped $Al_{0.31}Ga_{0.69}As$. The contact layers and the substrate are the same as in the previous sample.

The data for both samples are taken at $V_p=109mV$ for forward biasing (dashed curves) and $V_p=123$ mV for reverse biasing (solid curves). The detectivity of the two detectors is around $10^{10}\,cm\sqrt{Hz}/W$.

Other and different approximations to the multiple quantum well multicolor infrared photodetector may occur to those skilled in the art. Accordingly, having shown and described what is at present considered to be a preferred embodiment of the inventor, it should be understood that the same has been shown by way of illustration and not limitation. And, all modifications, alterations, and changes coming within the spirit and scope of the invention are herein meant to be included.

What is claimed is:

1. An infrared-radiation detection device comprising a semiconductor superlattice consisting of a plurality of quantum well units, each unit composed of a thick barrier, a thick quantum well having two confined states $E_1$ and $E_2$, a thin barrier, and a thin quantum well having one confined state $E_1$, adjusted to be very close to $E_2$ when the wells are considered in isolation, such that the thick quantum well and the thin quantum well are brought close enough together that the wells become coupled and the level structure becomes common to both wells, and contact means for electrically biasing said superlattice and for sensing an electrical signal in response to radiation incident on said superlattice.

2. An infrared-radiation detection device as defined in claim 1 in which a forward bias moves said energy levels $E_2$ and $E_3$ closer to level $E_1$.

3. An infrared-radiation detection device as defined in claim 1 in which a reverse bias moves said energy levels $E_2$ and $E_3$ further away from $E_1$.

* * * * *